United States Patent [19]
Stengl et al.

[11] Patent Number: 5,350,924
[45] Date of Patent: Sep. 27, 1994

[54] ION-OPTICAL IMAGING SYSTEM

[75] Inventors: Gerhard Stengl, Karnten; Alfred Chalupka, Vienna, both of Austria

[73] Assignee: IMS Ionen Mikrofabrikations Systems Gesellschaft m.b.H., Vienna, Austria

[21] Appl. No.: 912,099

[22] Filed: Jul. 10, 1992

[30] Foreign Application Priority Data

Jul. 10, 1991 [AT] Austria .................. 1388/91

[51] Int. Cl.5 .......................... H01J 37/317
[52] U.S. Cl. .............. 250/492.2; 250/396 R; 250/398
[58] Field of Search ............ 250/492.2 R, 492.21, 250/396 R, 398, 396 ML, 492.22, 492.23

[56] References Cited

U.S. PATENT DOCUMENTS

| | | | |
|---|---|---|---|
| 3,840,743 | 10/1974 | Tamura et al. | 250/396 R |
| 4,563,587 | 1/1986 | Ward et al. | 250/396 R |
| 4,687,940 | 8/1987 | Ward et al. | 250/492.21 |
| 4,740,694 | 4/1988 | Nishimura et al. | 250/306 |
| 4,740,698 | 4/1988 | Tamura | 250/310 |
| 4,755,685 | 7/1988 | Kawanami et al. | 250/492.2 |
| 4,820,927 | 4/1989 | Langner et al. | 250/492.2 |
| 4,823,011 | 4/1989 | Stengl et al. | 250/491.1 |
| 4,859,857 | 8/1989 | Stengl et al. | 250/492.21 |
| 4,958,078 | 9/1990 | Becchetti | 250/396 R |
| 4,985,634 | 1/1991 | Stengl et al. | 250/492.2 |
| 5,061,851 | 10/1991 | Noguchi | 250/396 R |
| 5,144,976 | 9/1992 | Sipma | 250/396 R |

FOREIGN PATENT DOCUMENTS

| | | |
|---|---|---|
| 0231164 | 8/1987 | European Pat. Off. . |
| 0281549A2 | 9/1988 | European Pat. Off. . |
| 0344646A2 | 12/1989 | European Pat. Off. . |

OTHER PUBLICATIONS

Microelectronic Engineering; May 1989, Nos. 1–4, Amsterdam, NL W. L. Brown; "Recent Progress in Ion Beam Lithography"; pp. 269–276.

*Primary Examiner*—Paul M. Dzierzynski
*Assistant Examiner*—Kiet T. Nguyen
*Attorney, Agent, or Firm*—Herbert Dubno

[57] ABSTRACT

A system for ion-beam imaging of a structure of a mask on a wafer has a two-lens set between the mask and the wafer which is one of the following combinations: (a) two accelerating Einzel lenses; (b) an accelerating immersion lens and a decelerating immersion lens wherein the accelerating immersion lens is the first collecting lens following the mask; (c) an accelerating immersion lens and a decelerating asymmetric Einzel lens wherein the accelerating immersion lens is the first collecting lens following the mask; (d) an accelerating asymmetric Einzel lens and a decelerating immersion lens wherein the accelerating asymmetric Einzel lens is the first collecting lens following the mask; and (e) an accelerating asymmetric Einzel lens and a decelerating asymmetric Einzel lens wherein the accelerating asymmetric Einzel lens is the first collecting lens following the mask.

12 Claims, 9 Drawing Sheets

ION-OPTICAL IMAGING SYSTEM

FIELD OF THE INVENTION

Our present invention relates to an ion-optical imaging system for producing an image on a wafer, especially a silicon wafer or other substrate for the production of integrated circuitry and the like by a lithographic process. More particularly, the invention relates to an imaging system in which between the structured mask, having at least one opening forming the structure to be imaged by an ion beam on the wafer, and the wafer itself, a combination or set of two collecting lenses is provided so that the mask lies at least approximately in the object-side focal plane of the first lens following the mask and the wafer lies in the vicinity of the image-side focal plane of the second collecting lens following the mask and, preferably, the crossover of the first lens lies substantially in the object side focal plane of this second lens.

BACKGROUND OF THE INVENTION

Reference may be made to one or more of the following patent documents: European patent application 87 89 0020.8 filed Jan. 30, 1987 and published as 0 231 164A2 on Aug. 5, 1987 citing as inventors Dr. Hans Loeschner, Dr. Gerhard Stengl and Dr. Peter Wolf; U.S. Pat. No. 4,823,011 issued Apr. 18, 1989 to Gerhard Stengl and Hans Loeschner; U.S. Pat. No. 4,985,634 issued Jan. 15 1991 to Gerhard Stengl and Hilton F. Glavish, all commonly owned with the present application, and to the references and documents cited therein. Reference may also be made to U.S. Pat. Nos. 4,563,587 (Ward et al), 4,740,694 (Nishimura et al) and 4,755,685 (Kawanami et al).

As will be apparent from these documents among others, the production of semiconductor components can be effected by lithography utilizing a series of steps, in one of which, a structure of a mask may be imaged upon a wafer.

In a simplified version, the lithographic process for producing semiconductor components begins with the application of a thin layer of a light-sensitive material, referred to generally as a photoresist or simply as a resist, upon a wafer forming the semiconductor substrate, generally a silicon wafer.

A lithographic apparatus projects a structure of a mask upon the resist coating of the wafer and usually the extent of the projected structure on the wafer is much smaller than the area of the wafer. Subsequently, the wafer is shifted and the structure of the mask is then projected on another location of the wafer.

These steps of projection and shifting are repeated until the entire wafer surface is used.

The resist is then developed and the wafer has a desired pattern in the form of a multiplicity of resist-free locations or zones. In subsequent steps, the wafer can be subjected to processes such as etching, ion implantation or application and diffusion of doping materials to form the desired local compositions and structures.

After these further steps, the wafer is inspected, coated again with a resist, and subjected once more to the lithographic steps so that after 8 to 15 repetitions of these steps, a checkerboard arrangement of substantially identical microcircuits are formed on the wafer. The wafer can then be cut up, the microcircuits encapsulated and provided with terminals, etc.

Most of the present-day projection lithographic processes utilize light to irradiate the resist. However, the need for ever smaller structures and higher densities of the components of the microcircuits has resulted in intensive research into other irradiation methods which are not limited in their resolution to that of light with relatively large wavelengths. For example, the use of X-rays has been attempted and also other processes like ion-beam lithography, although these methods have not found as widespread an application as the light-beam photolithographic processes.

OBJECTS OF THE INVENTION

It is, therefore, the principal object of the present invention to provide an improved ion-optical imaging system which avoids the limitations and drawbacks of existing systems and thus can provide high resolution and efficient lithographic imaging of the structure of a mask upon a substrate.

Another object of the invention is to provide an improved ion-beam lithographic system for the production of microcircuits on a wafer or like substrate.

SUMMARY OF THE INVENTION

We have discovered that these objects can be attained by providing the lens system between the mask and the wafer as a specific combination of two collecting lenses as will be detailed below.

More particularly, the imaging system of the invention comprises:

a mask having a structure to be imaged upon a wafer and including at least one opening;

means for supporting the wafer upon which the structure is to be imaged at a distance from the mask along an optical axis; and a lens system disposed between the mask and the wafer and essentially consisting of a set of two collecting electrostatic lenses including a first collecting lens following the mask along the axis in a direction of ion beam travel toward the wafer, and a second collecting lens spaced from a following the first collecting lens along the axis in the direction of ion beam travel, the mask being disposed approximately in an object-side focal plane of the first collecting lens proximal to the mask, the wafer being positioned in a vicinity of an image-side focal plane of the second collecting lens following the mask, and the set is constituted of one of the following lens-type sets:

(a) two accelerating Einzel lenses;
(b) an accelerating immersion lens and a decelerating immersion lens wherein the accelerating immersion lens is the first collecting lens following the mask;
(c) an accelerating immersion lens and a decelerating asymmetric Einzel lens wherein the accelerating immersion lens is the first collecting lens following the mask;
(d) an accelerating asymmetric Einzel lens and a decelerating immersion lens wherein the accelerating asymmetric Einzel lens is the first collecting lens following the mask; and
(e) an accelerating asymmetric Einzel lens and a decelerating asymmetric Einzel lens wherein the accelerating asymmetric Einzel lens is the first collecting lens following the mask.

An immersion lens is understood to be a system in which along the optical axis two coaxial rotationally symmetrical electrodes, e.g. two coaxial tubes, are provided at different potentials and spaced by a gap. If the ions at the transition between the first and second electrode are accelerated, the immersion lens is referred to as an accelerating lens. If the ions in this transition between the first and second electrodes are decelerated, the lens is referred to as a decelerating immersion lens. At the inlet and outlet side and to reduce the length of the lenses, they may be provided with closure diaphragms whose openings are provided only of the requisite sizes for the ion beam passage.

The reference to an Einzel lens is a reference to a system having along the optical axis three coaxial rotationally symmetrical electrodes of which the first and third are at the same potential and the central electrode is of a different potential (see U.S. Pat. No. 4,985,634 for a more detailed description of the Einzel lens). If the ions are initially accelerated upon entry of the lens and are braked in the second half of the lens again to the original energy, one refers to the lens as an accelerating Einzel lens. In the opposite case, the lens is referred to as a decelerating Einzel lens. In the overall sense, the particle energy does not change in passage through the Einzel lens since the beginning and end thereof are at the same potential.

An asymmetrical Einzel lens is understood to be an Einzel lens as described in which the three electrodes are at three different potentials. In this case, upon passage of the beam through the lens, the particles undergo a change in particle energy and, in the same manner as was used to describe the immersion lens, we can refer to an accelerating or decelerating asymmetric Einzel lens when, during passage through the lens, the particles encounter a potential which increases from the first electrode to the third electrode or decreases from the first electrode to the third electrode to respectively increase or decrease the ion energy. Asymmetric Einzel lenses are employed since they have reduced image errors (distortion) than the corresponding immersion lenses for the same starting and ending voltages and the same electrode diameter.

With the aid of each of the two lens combinations a-e set forth above, it is possible to irradiate the resist with very low energy ions. As a result, with substantially higher definition (depth of field) by comparison of light, submicron structures of less than 0.25 $\mu$m can be realized and the disadvantages of X-ray lithography, namely, the formation of defects in the silicon substrate can be avoided because ions of the low energy here used (up to 10 keV) can be stopped in resist layers within the thickness of about 0.5 $\mu$m and thus cannot reach the substrate.

The imaging system of the invention, therefore, permits defect-free ion lithography so that the structures imaged upon a wafer can be reduced. The system is also suitable for large image fields (20×20 mm$^2$) with close to distortion-free (maximum distortion <0.2 $\mu$m) and sharp (lack of sharpness due to chromatic errors <0.1 $\mu$m) images. By appropriate choice of the voltages for the electrostatic collecting lenses, the ion energy at the wafer ($E_W$) can be substantially the same as the ion energy at the mask ($E_M$). The ratio $E_M/E_W$ (ion energy at the mask to ion energy at the wafer) can lie in the range of 0.5 to 2. It is then possible to reduce the ion energy at the wafer to about 5–10 keV. In this case, the ions can be stopped fully in the resist and no longer penetrate to the Si substrate to ensure that the photolithographic process will not generate defects in the substrate.

The fact that the resist is not fully irradiated throughout its thickness is not a problem since the development process can deal with such partially irradiated resist thicknesses.

A further characteristic of the ion-optical imaging system of the invention is that the above described effect can be obtained with an ion projection apparatus which can be provided in accommodations hitherto used for ion implantation apparatus. In the imaging system of the invention, a distance of about 3 m between mask and wafer can be provided so that the total length between ion source and wafer is about 6 m for a 20×20 mm$^2$ image field size.

By comparison with earlier ion projection lithographic systems, therefore, the invention provides lithography with very low ion energies at the wafer and in addition permits, for a given machine size, substantially larger image field sizes.

In the embodiment in which the set of collecting lenses is formed by two accelerating Einzel lenses, exactly identical ion energies can appear at the mask and the wafer so that both of these significant components can be simultaneous at ground potential, thereby providing a substantial simplification and cost saving with respect to the control, measurement and regulation units at the two locations.

From the point of view of the use of an accelerating immersion lens as the first collecting lens following the mask and a decelerating immersion lens as a second lens immediately ahead of the wafer, it can be said that there is an especially simple construction of the unit since only two electrodes per lens need be provided. This arrangement is especially suitable for a system in which the ion energy at the wafer may be smaller than that at the mask.

The combination of an accelerating immersion lens as the first lens following the mask, and an decelerating asymmetric Einzel lens as the second lens immediately ahead of the wafer or the combination of an accelerating asymmetric Einzel lens as the first lens following the mask and a decelerating immersion lens as the second lens ahead of the wafer provide substantially the same results as the arrangement with two accelerating Einzel lenses but allow a system to be realized in which the ion energy in the region of the wafer is smaller than that in the region of the mask.

In general, with these latter lens combinations, by comparison with the other lens geometries according to the invention, ion projection lithographic systems can be provided which achieve desired results only for a certain ratio between the ion energy at the wafer and the ion energy at the mask since the system has fewer selectable parameters (e.g. lens voltages) which can be optimized for the selected energy ratios.

In the embodiment of the invention in which an accelerating asymmetric Einzel lens is the lens of the set immediately following the mask, i.e. the first lens, and a decelerating asymmetric Einzel lens is the lens immediately ahead of the wafer, i.e. the second lens, there is, of course, a higher cost involved since it is necessary to provide four different lens voltages. However, because of the greater number of parameters which can be varied, the flexibility of control of this lens combination renders it desirable when a freely selectable or predetermined energy ratio between ion energy at the mask and the ion energy at the wafer must be selected and when this ratio differs from unity.

In the ion projection lithographic system of the invention, the illumination of the mask in practice is not effected directly by the ion source. Rather an illumination system is provided upstream of the mask in the direction of travel of the ion beam so that the position of the virtual source point for illumination of the mask can be varied at will and thus the distance between the true ion source and the mask can be provided so that it does not exceed about 3 to 4 m, as is important on structural grounds.

For the virtual source, however, greater distances are desirable on two grounds. In one case, the greater distance allows optimal freedom from distortion (see the examples) by providing the beam impinging on the mask so it is approximately parallel; this normally would require a distance between the virtual ion source and the mask of several tens of meters.

The second reason is that, for mask stability, a thickness of the mask of several $\mu m$ is required and this means that aberration resulting from the mask thickness should be avoided by having the ion beam impinge as perpendicularly to the mask as possible. For example, for structures of the mask, like a 5 $\mu m$ wide slit, to be imaged on the wafer without the casting of shadows, the angleof incidence of dthe ions against sthe maskk must be limited to 0.1 or less. For a mask size of $60 \times 60$ mm$^2$, this also leads to a similar minimum distance of the virtual ion source from the mask.

It should be noted further that each ion source emits, in addition to the desired ions, a number of undesirable ion types which should be eliminated before the ion beam impinges upon the wafer.

According to the invention, therefore, the illumination device for the mask in the ion-optical imaging system of the invention comprises a so-called ion source lens which may be constituted as an accelerating or decelerating Einzel lens and a mass separator formed as an ExB filter immediately following the ion source lens.

A so-called illumination lens can follow the mass separator and can, alternatively, be constituted as an immersion lens or as an accelerating or decelerating Einzel lens or as one or more solenoids.

In such an illumination system, therefore, the Einzel lenses of short focal length form an image of the ion source at the center of the mass separator which can be a Wien filter (ExB filter), i.e. an arrangement with a homogeneous electric field on which a homogeneous magnetic field perpendicular thereto is superimposed. For ions of the desired mass, the forces applied by the two fields compensate each other so that the ions pass axially through the system. For all other ions, this is not the case and they are removed from the beam by deflection. Subsequently, the illumination lens generates a virtual image of the ion source thus realizing distances of the virtual ion source from the mask which can range between several tens of meters to several hundreds of meters.

The illumination lens must have a similar high quality as the two collecting lenses since the distortion thereof, in combination with the distortion of the imaging lenses can lead to additional fifth order distortions and can be a great detriment with respect to the overall distortion of the system. As the illumination lens, therefore, we prefer to use an electrostatic Einzel lens whose dimensions and qualities match those of the imaging lenses.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
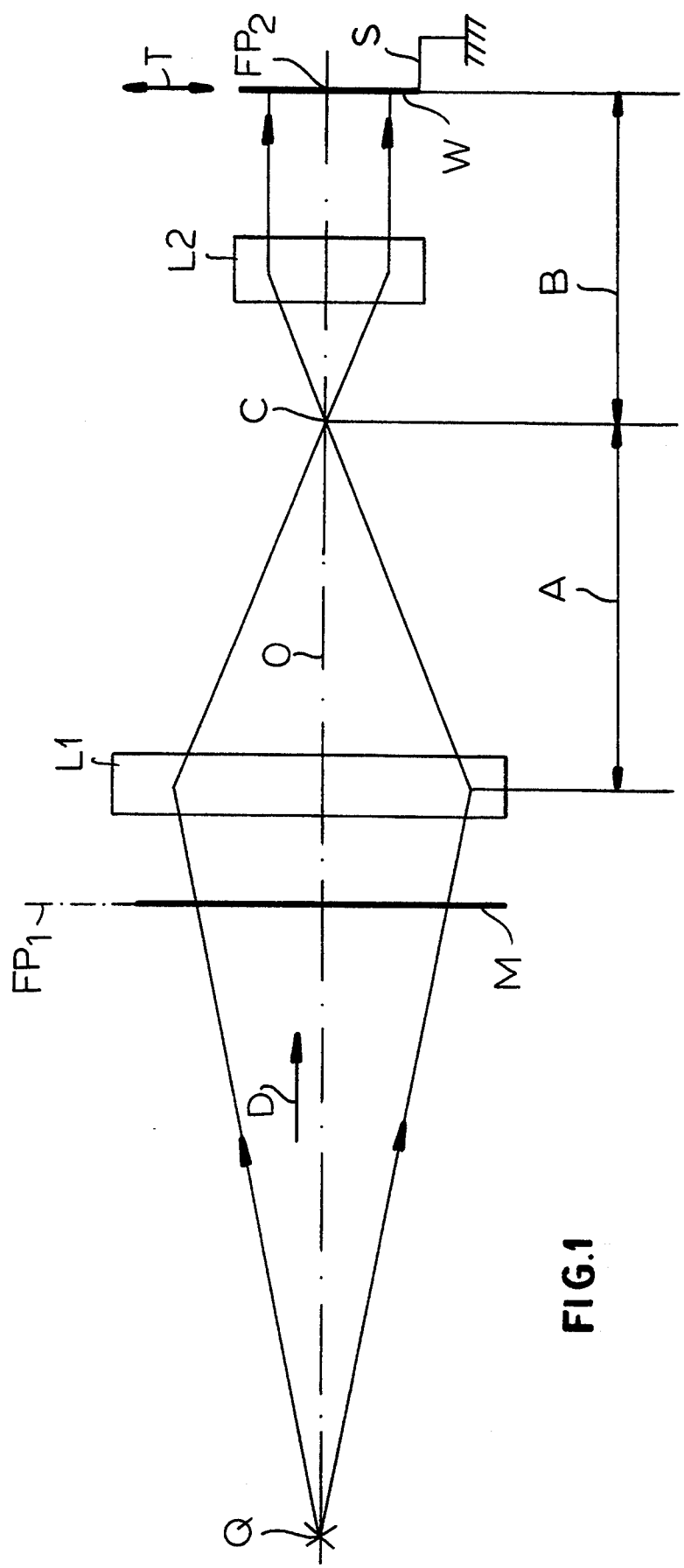
FIG. 1 is a schematic illustration of the beam path in an ion beam projection lithographic system with two collecting lenses according to the invention.

In the Figures of the drawing which illustrate the ion beam photolithographic system, the mask is represented diagrammatically at M while the wafer is shown at W and is provided on a support represented at S so designed as to enable the structure of the mask, in the form of one or more holes traversed by the ions of the ion beam, to be imaged at selected locations on the wafer and such that the wafer and the optical axis O of the ion optical system can be stepped transversely to the axis as represented by the arrow T so a checkerboard pattern of exposure of the wafer can be effected. These principles are set out in the patent documents previously made of record.

As noted, for an ion beam system, the structure of the mask M which is to be imaged upon the wafer, will be generally in the form of openings, e.g. slits or holes, which can be provided in the foil constituting the mask and which can be composed of silicon.

With respect to FIGS. 1–4, the ions are assumed to derive from an ion source Q of a very small virtual size which may be approximately 10 $\mu m$ and which is located at some distance from the mask M.

The mask M is located approximately in the focal plane $FP_1$ of a first collecting lens L1.

This collecting lens L1 has a crossover (real image of the ion source Q) at the location C, shortly behind its image-side focal point if the distance between the ion source Q and the lens L1 immediately following the mask, i.e. the first lens in the direction of beam travel D is large when compared with the focal length of the collecting lens L1.

The object side focal point of the second collecting lens L2 located ahead of the wafer W can also lie at the crossover C. As a result, the beam of ions leaves the collecting lens L2 substantially parallel to the axis and the result is an approximately telecentric ion-optical system. This has the advantage that the image multiplication does not change with small shifts in the position of the wafer W along the ion optical axis.

The system utilizes as the collecting lenses L1 and L2, Einzel lenses, immersion lenses or asymmetrically Einzel lenses with the following characteristics:

(a) By the combination of the collecting lenses L1, L2, i.e. a set of two lenses, the image field containing the structure of the mask is imaged on the wafer W in a plane in vicinity of the image-side focal point $FP_2$ of the collecting lens L2 located ahead of the wafer W.

(b) The bundle of the beam undergoes a barrel-shaped distortion by the collecting lens L1 following the mask M (region A) the barrel-shape distortion being transformed into a cushion-shaped distortion past the crossover C (region B).

Figure 2:
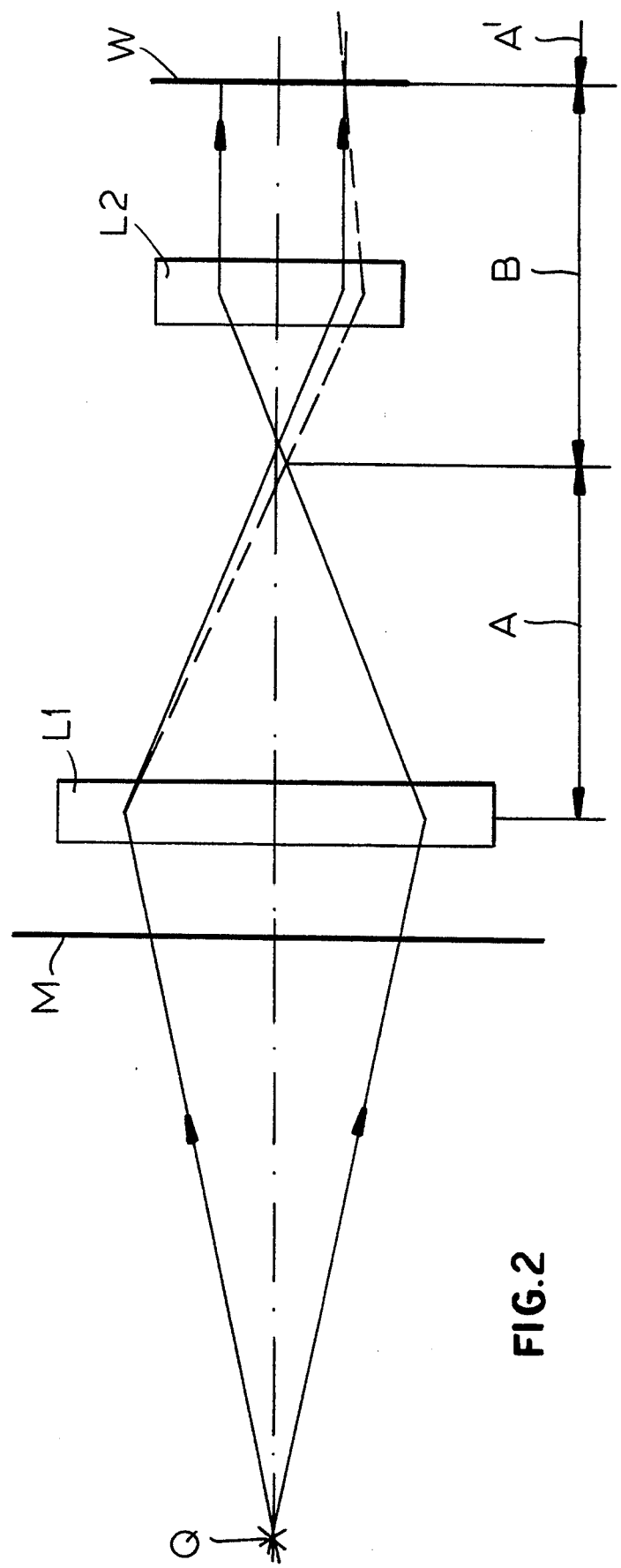
FIG. 2 is a diagram analogous to FIG. 1 showing in solid lines the beam path for ideal distortion-free lenses and in the broken line path the beam path considering the distortion.

FIG. 2 shows that, because of the distortion ahead of the wafer W at the collecting lens L2, the beam undergoes an additional refraction which reduces this cushion-shaped distortion (region B) and again yields a barrel-shaped distortion in the region A'. Thus behind the lens L2 located ahead of the wafer W, there is a plane in which the distortion resulting from the two collecting lenses L1 and L2 is compensated. This, however, applies only to distortions of a third order. There remain however distortions of a fifth order, which are very much smaller than distortions of a third order. The distortion, therefore, does not disappear entirely but is substantially reduced. For a given image size, this residual distortion is inversely proportional to the fifth power of the distance between the mask and wafer with uniform change of all dimensions in the optical system between the mask and wafer.

Figure 3:
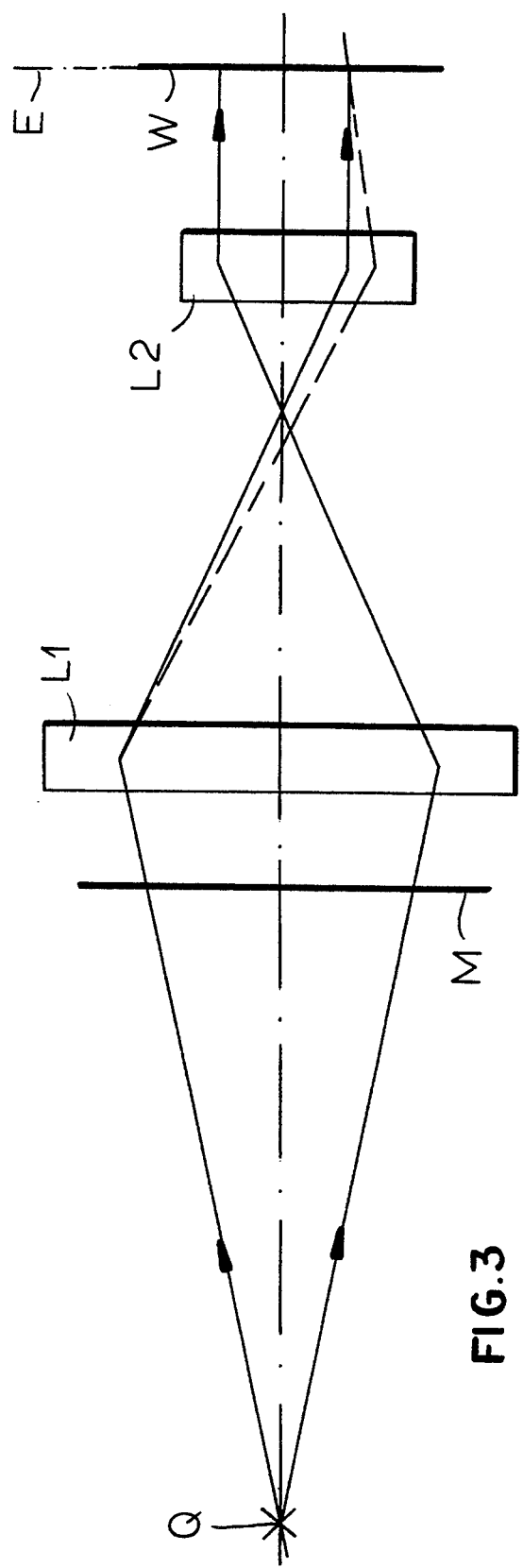
FIG. 3 is a diagram of a system analogous to FIG. 1 in which the solid lines show the beam path with a set point energy $E_0$ and an energy reduced with respect to the set point energy to depict the correction of chromatic aberration.

(c) In the arrangement of FIG. 1, there is also a compensation for chromatic aberrations at a predetermined image plane behind the collecting lens L2 ahead of the wafer W, as is apparent from FIG. 3.

A beam (illustrated in FIG. 3 by broken lines) with somewhat smaller energy $E_o - \Delta E_o$ than the set point energy $E_o$ is more strongly refracted in the first collecting lens L1 following the mask M and thus impinges upon the second lens L2 ahead of the wafer W at a greater distance from the axis than the beam represented in solid lines for the set point energy. The beam with the lower energy and greater refraction meets the set point beam at a predetermined spacing behind the lens L2 located ahead of the wafer W. In this plane E, the chromatic aberrations of a first order appear to disappear. Here as well, there may remain a residual error in the form of chromatic aberrations of the second order, i.e. chromatic aberrations which are proportional to a square of the energy deviation from the set point energy.

(d) The three relevant planes, namely the Gaussian plane of the mask M, the plane of minimum distortion and the plane E of minimal chromatic aberration generally do not coincide.

By appropriate choice of the collecting lenses L1 and L2 and the location of the ion source, it can, however, be ensured that while maintaining a parallel ion beam, these three planes will coincide. If the wafer W is positioned where these three planes coincide, in the image plane of the mask on the wafer W, there will be a minimum of distortion and chromatic aberration.

The image reduction factor (ratio of image size to object size in the optical system), with which the structure of the mask is imaged on the wafer W, is approximately equal to the ratio of the image-side focal length of the first collecting lens L1 following the mask to the object-side focal length of the second collecting lens L2 ahead of the wafer W.

By scaling (for example increasing or decreasing by the same factor all dimensions of lens L2), it is possible to vary the reduction factor of the image system while maintaining all other characteristics, i.e. correction for distortion and the chromatic aberration at the Gaussian image point of the mask.

In the practical realization of such system, the sets of collecting lenses which can be used can employ different types of electrostatic lenses, namely:

(1) accelerating or decelerating immersion lenses,
(2) accelerating or decelerating Einzel lenses, and
(3) accelerating or decelerating asymmetric Einzel lenses.

For the practical realization of the ion-optical imaging systems of the invention, the following combinations or sets of collection lenses L1 and L2 can be used:

(aa) accelerating Einzel lens-accelerating Einzel lens;
(bb) accelerating immersion lens-decelerating immersion lens;
(cc) accelerating immersion lens-decelerating asymmetric Einzel lens;
(dd) accelerating asymmetric Einzel lens-decelerating immersion lens;
(ee) accelerating asymmetric Einzel lens-decelerating asymmetric Einzel lens.

Figure 9A:
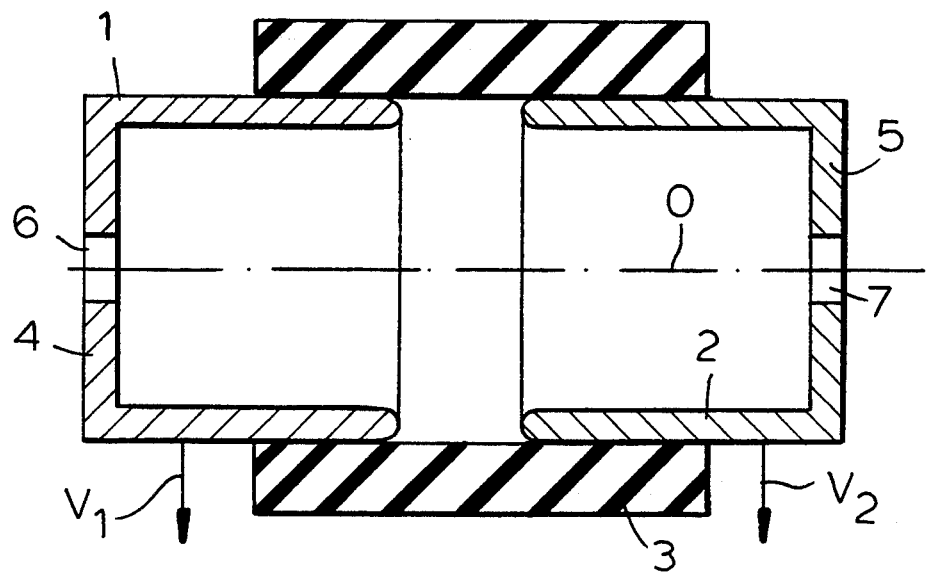
FIG. 9a is a schematic diagram in section of an immersion lens of rotationally symmetrical shape.

In FIG. 9a, an immersion lens in axial cross section has been illustrated and can be seen to comprise two mutually coaxial rotationally symmetric electrodes 1 and 2. These electrodes are received in a sleeve 3 of insulating material. Each of the electrodes has a bottom 4 or 5 provided with a hole 6 or 7 along the optical axis O, for admission and discharge of the ion beam, respectively. The electrodes 1 and 2 have different voltages V1 and V2 applied to them as represented by the lines V1 and V2, respectively. If the lens is an accelerating lens, the ions are accelerated between the electrodes and the device is an accelerating immersion lens. If the ions are decelerated, the device is a decelerating immersion lens.

Figure 9B:
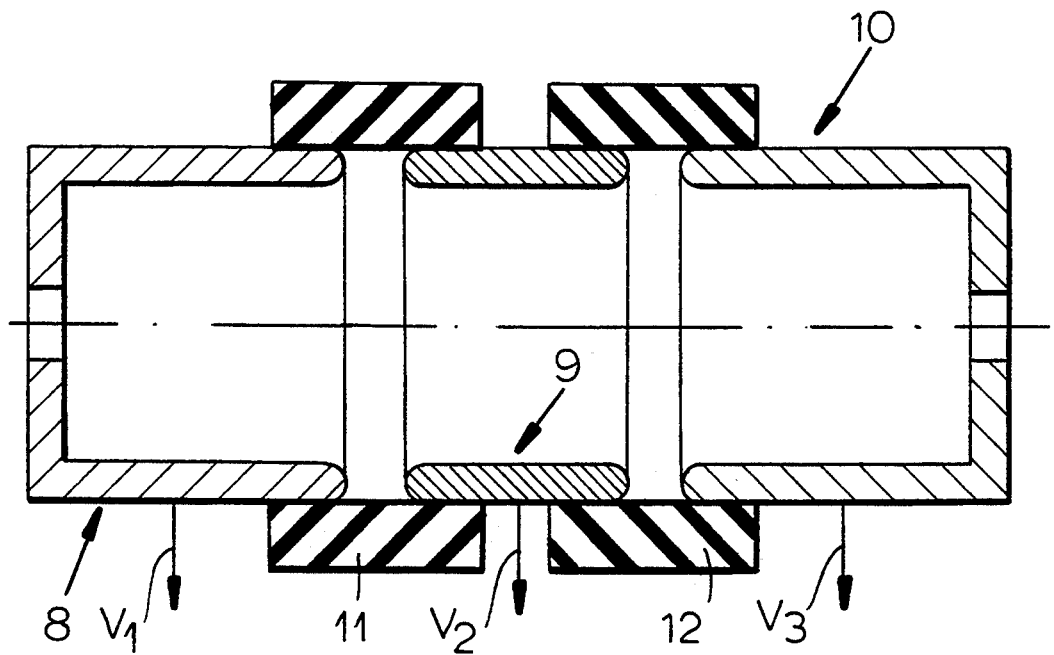
FIG. 9b is an axial section showing the basic construction of the Einzel lens, also in a configuration of a rotationally symmetrical body.

FIG. 9b shows in highly diagrammatic form the basic construction of an Einzel lens. The Einzel lens comprises three electrodes 8, 9, 10 which are received in and are insulated from one another by respective insulating sleeves 11 and 12. In a normal Einzel lens, the electrode 9 is of a potential V2 which is different from the potentials V1 and V3 applied to the electrodes 8 and 10. If the electrodes V1 and V3 are equal and the ions, depending upon the potential V2 are accelerated, the device is referred to as an accelerating Einzel lens (EL+). If the ions are decelerated, the device is referred to as a decelerating Einzel lens (EL−).

If the potentials V1 and V3 of the terminal electrodes 8 and 10 differ from one another, the device is referred to as an asymmetric Einzel lens. Also with an asymmetric Einzel lens, depending upon the potential of the middle electrode 9, the ions can be accelerated or decelerated on passing through the lens and thus one can refer to an accelerating asymmetric Einzel lens (AEL+) or a decelerating asymmetric Einzel lens (AEL−).

SPECIFIC EXAMPLES

Below we have given numerical values for three different combinations of pairs of collecting lenses for which the imaging characteristics of the ion projection lithographic system has been tested.

In the first case, the collecting lenses are formed as a combination of an accelerating electrostatic immersion lens and a decelerating electrostatic immersion lens with an electrostatic accelerating Einzel lens used as an illuminating lens, i.e. as a lens upstream of the mask.

Case 2 utilizes a combination of an accelerating electrostatic immersion lens and a decelerating asymmetric electrostatic Einzel lens as the lenses L1 and L2 of the set, with an electrostatic accelerating Einzel lens as the illuminating lens.

Case 3 is a combination of two electrostatic accelerating Einzel lenses forming the lenses L1 and L2 of the set with a further electrostatic accelerating Einzel lens as the illuminating lens upstream of the mask.

For all of these lens combinations, the image of a mask having a structured image field of $60 \times 60$ mm$^2$ with a reduction factor of 3 onto a wafer surface with an area of $20 \times 20$ mm$^2$ was effected.

Figure 5:
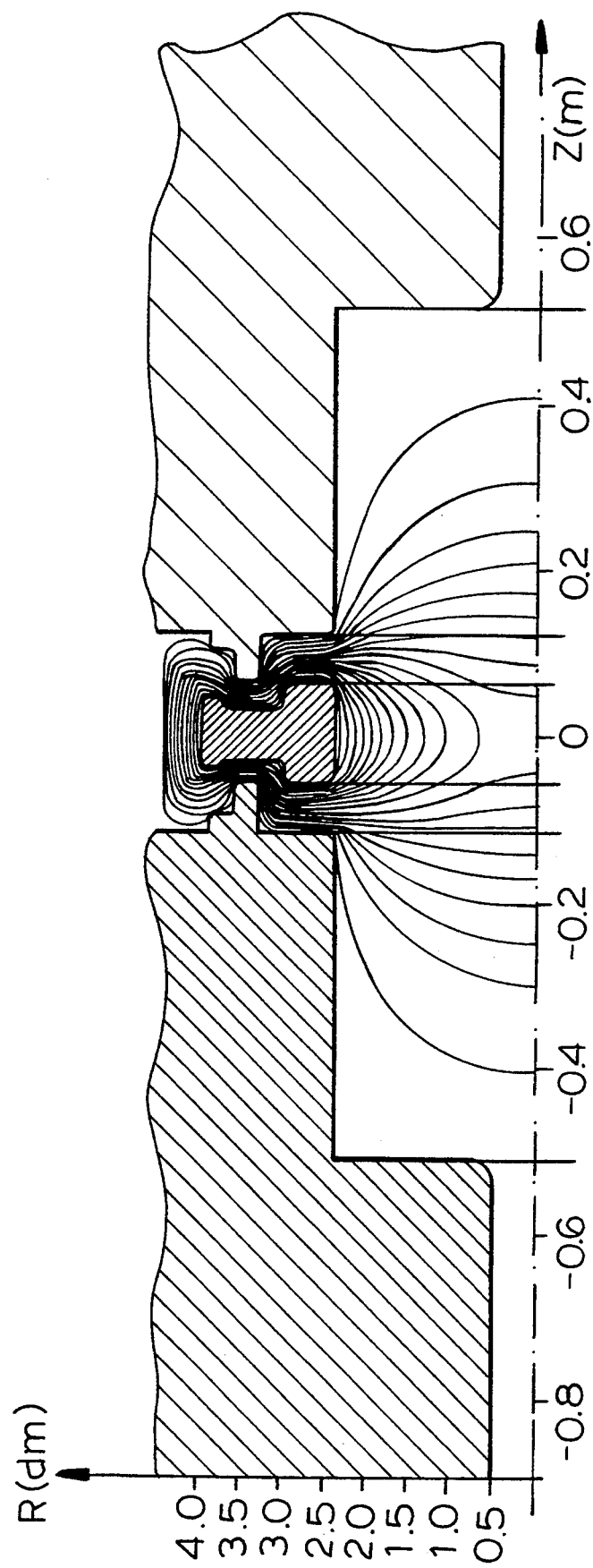
FIG. 5 is a diagram of an Einzel lens seen in axial section with potential lines illustrated thereon.
Figure 6:
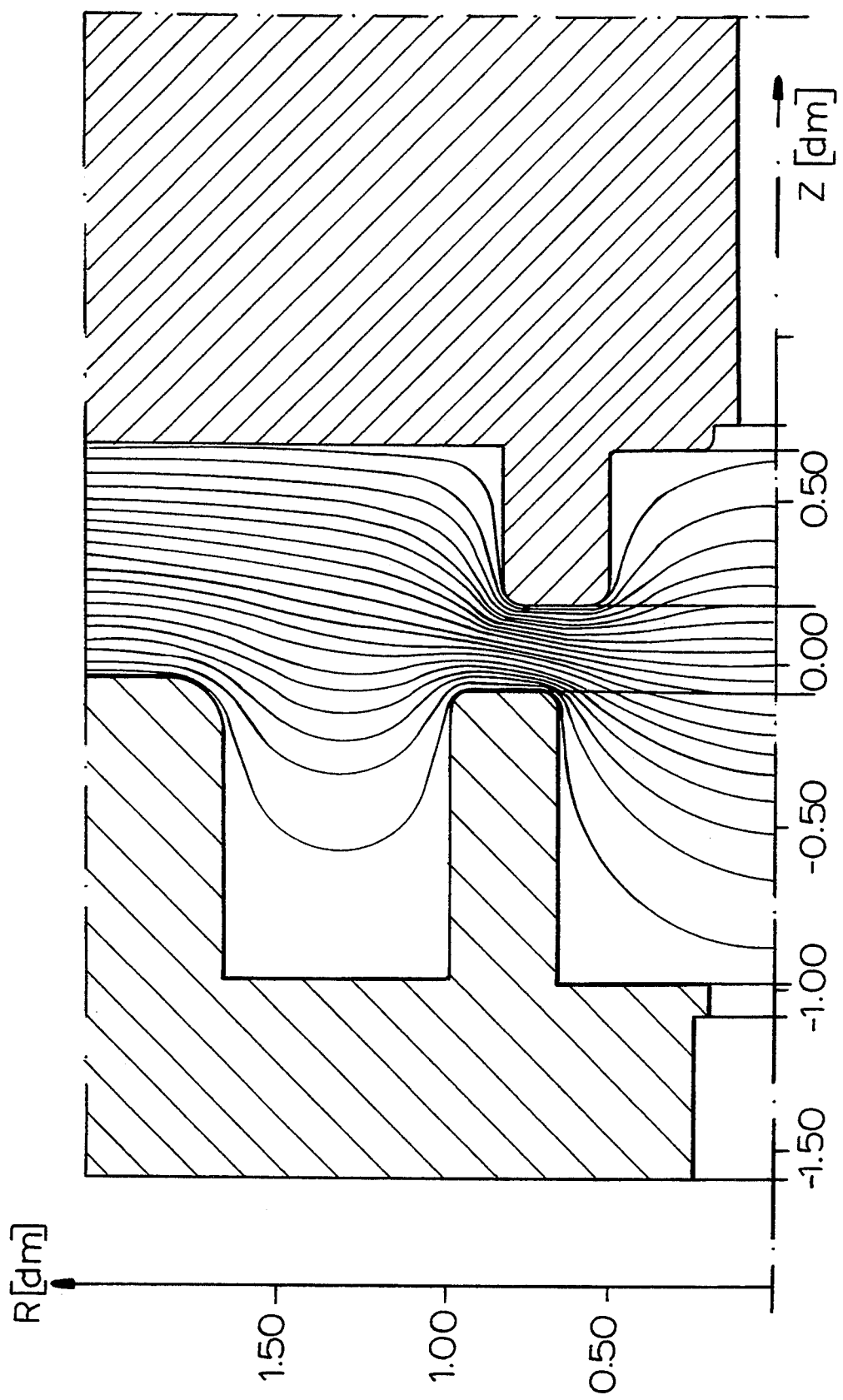
FIG. 6 is an axial longitudinal section of an example of an imaging system according to the invention in which one collecting lens is formed as an accelerating immersion lens and the second collecting lens is a decelerating immersion lens, also illustrating the potential lines relevant thereto.
Figure 7:
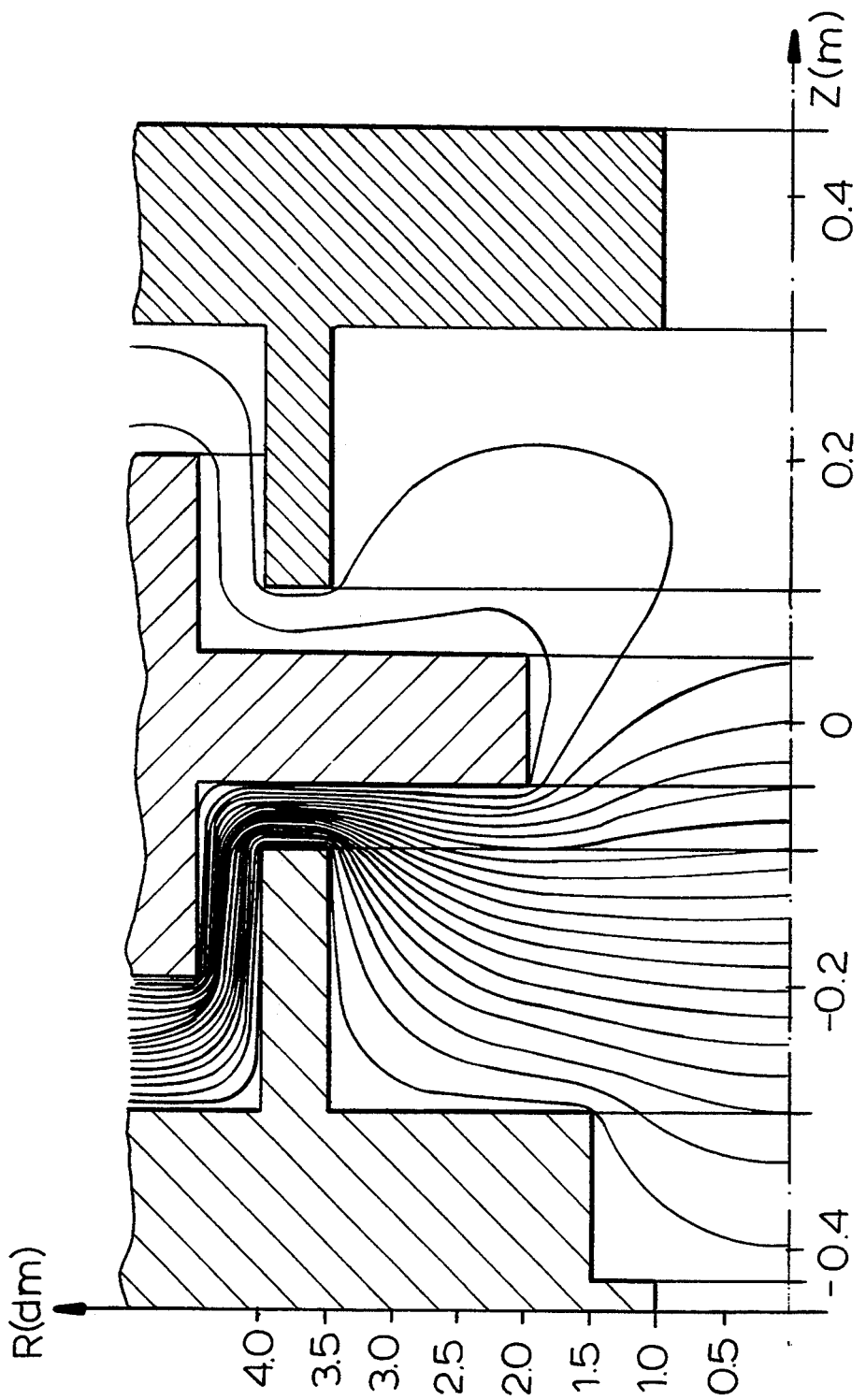
FIG. 7 is another axial section showing a decelerating asymmetric Einzel lens with potential lines depicted thereon, whereby this lens coacts with an accelerating immersion lens as the other collecting lens.

The numerical values were obtained in the following steps:

1. Calculation of the potential distribution for a given lens geometry from the potential equation for the two lenses which are combined. For immersion lenses and Einzel lenses, a single calculation is sufficient. For asymmetric Einzel lenses, the calculation must be carried out for a series of different voltages on the two terminal electrodes. FIGS. 5–7 show examples for the calculated equipotential lines of the lenses used.

2. Calculation of the lens parameters of first, third and fifth order as a function of the voltage ratio between the electrodes of the lens (or in the case of asymmetric Einzel lenses, the two voltage ratios). This was effected as follows:

Initially the electric field was determined from the potential values calculated from the potential equation and it was found that, to ensure sufficient precision, the two dimensional cubic interpolation was required. Then a number of particle paths through the lens were calculated by numerical integration. These paths were uniformly distributed over the interesting illumination range of the lens.

From the positions of the paths at the lens end, the transfer matrix in the first, third and fifth orders can be determined and at the same time, the errors of the matrix elements can be ascertained. Calculations of this type with different injection energies of the ions yields the transfer matrix for different voltage ratios.

As a result of this series of calculations, the transfer matrix in the fifth order is obtained for the lenses researched as a function of the voltage ratio (or the two voltage ratios in the case of asymmetric Einzel lenses).

3. According to the standard method of matrix multiplication, the beam trajectory through systems comprised of two lenses and drift path segments were calculated from a given starting point (mask) to a given end point (wafer) and the transfer matrix calculated therefrom (see the drawing). The matrices for the lenses as a function of the voltage ratio at the electrodes were taken over from the results of step 2.

Figure 8:
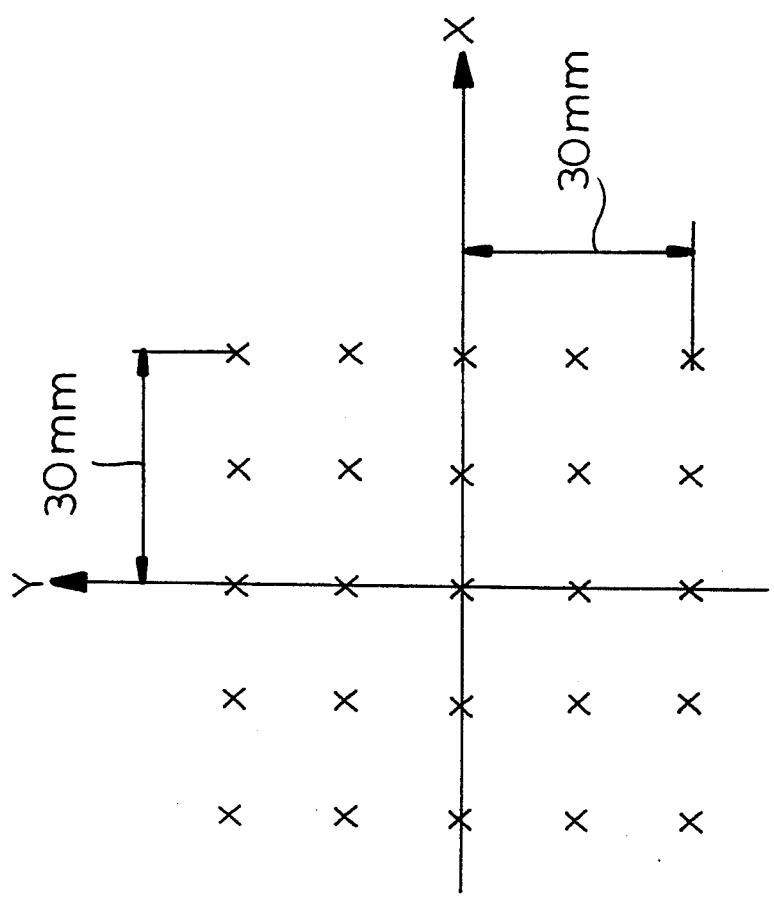
FIG. 8 is a graph showing the positions of the starting points of ions on the mask, the trajectory of the ions having been investigated through the system of two collecting lenses.

From the transfer matrices obtained, the image locations for a series of starting points of the mask are calculated and FIG. 8 shows the starting points utilized in these calculations at the mask. The direction of the rays starting from these masks is determined by the assumed position of the ion source and the location and refractive power of the illumination lenses (see FIG. 4) and can also be calculated.

From the positions of the image points, with a linear fit, average and maximum values of the distortion can be obtained from the displacement of the calculated image points from the corresponding fit lines. Furthermore, such image point calculations can be carried out as well for energies which differ by a small amount ($\Delta E_O$) from the set point energy ($E_O$), so that values for chromatic aberration of the lens system can be determined.

4. The imaging system of the invention including the selected combination of the two lenses can be optimized with respect to image distortion. By iteration an optimization with regard to a simultaneous minimization of the distortion and chromatic aberration can be obtained and thus, as may be desired, a number of collateral advantages can be obtained.

With the examples given here, the following considerations apply:

1. Collateral conditions which had to be satisfied:
    (1. a) Parallel ion beam at the outlet side of the imaging system, i.e. ahead of the wafer and following the second collecting lens located upstream of the wafer.
    (1. b) A Gaussian image of the mask M on the wafer.
    (1. c) Image reduction of the mask-wafer imaging (usually ⅓).

2. The following parameters were varied for the purpose of image distortion minimization while maintaining the aforedescribed accelerating conditions:
    (2. a) Distance between the mask M and the first lens following the mask L1,
    (2. b) Distance between two collecting lenses L1 and L2,
    (2. c) Distance between the wafer W and the lens L2 immediately ahead of the wafer, and
    (2. d) The scaling factor, namely, the reduction or increase in size produced by the collecting lens L2 immediately ahead of the wafer.

3. For further optimization the voltage ratio between the electrodes of the two collecting lenses L1 and L2 can be varied.

The results are given in the following table 1, and can be summarized as follows:

1. With all three lens combinations, the $60 \times 60$ mm$^2$ object field of the mask M was imaged on the wafer W and reduced to ⅓ in the image field. At the wafer W (the image plan), a minimum of distortion (maximum distortion less than 0.2 $\mu$m) and a minimum of image blurring (less than 0.1 $\mu$m) were simultaneously achieved.

2. In all cases a machine length (distance between mask M and wafer W) of about 3.5 m was required and the three lens combinations were substantially equivalent in this respect.

3. In all three cases, energy ratios between ion energy and the wafer W and ion energy at the mask M was in the range of 0.7 to 1.0.

4. In the case of the combination of two asymmetric Einzel lenses with the first Einzel lens being accelerating and the second a decelerating lens, a similar quality can be achieved since in comparison to the three cases listed in table 1, a further parameter is available for optimizing the overall system, namely an additional voltage ratio.

The examples show that a projection lithographic system can be obtained with low ion energy, low distortion, high resolution and telecentricity at the wafer W with all of the combinations. When a mask with only one aperture is used, the lens combinations of the invention allow the single beam of low energy to be employed with high resolution also for the repair of masks and chips or for the modification of chips and masks.

Figure 4:
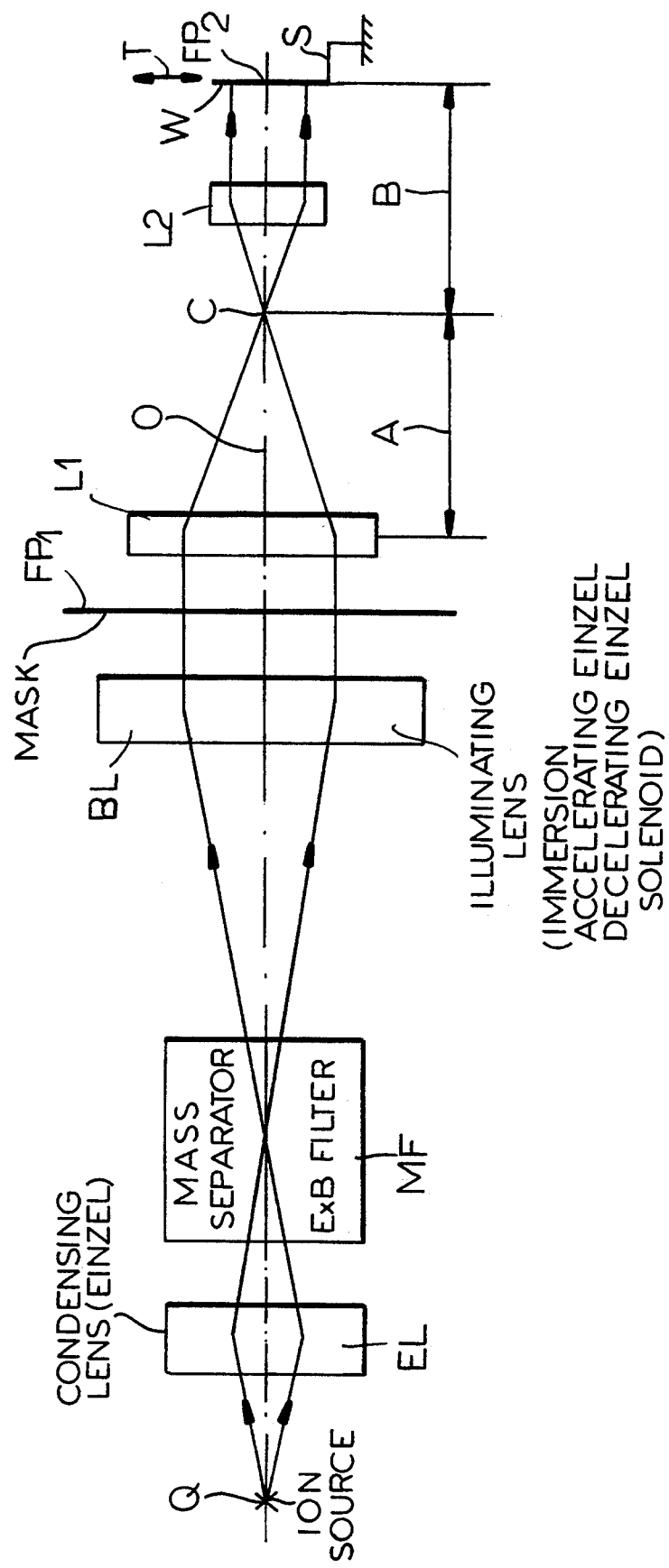
FIG. 4 shows an illumination device, also in highly diagrammatic form, which can be used for all combinations of the two collecting lenses of the invention.

The illumination system which may be used in any of the embodiments of FIGS. 1–3 and as described can be that illustrated diagrammatically in FIG. 4 and which comprises downstream of the ion source Q, an Einzel lens EL and followed by the ExB filter previously described functioning as a mass separator and represented at MF.

Following that mass separator, an illuminating lens BL may be provided which can be an immersion lens, an accelerating or decelerating Einzel lens, or one or more solenoids.

TABLE 1

| System | Example 1 | Example 2 | Example 3 |
|---|---|---|---|
| Illuminating Lens | EL+ | EL+ | EL+ |
| Voltage Ratio $V_2/V_1$ | 3.83 | 3.77 | 3.88 |
| 1. Collecting Lens | IL+ | IL+ | EL+ |
| Voltage Ratio | 8.42 | 6.99 | 6.85 |
| 2. Collecting Lens | IL− | AEL− | EL+ |
| Voltage Ratio | 0.085 | 0.122 | 10.000 |
| " $V_2/V_3$ | — | 1.10 | — |
| " Mask-Wafer Distance (m) | 3.50 | 3.53 | 3.42 |
| Reduction Factor | 3.00 | 3.00 | 3.00 |
| Max. Distortion ($\mu$m)[1] | 0.21 | 0.24 | 0.20 |
| Max. Chromatic Aberration ($\mu$)[2] | ±0.08 | ±0.08 | ±0.06 |
| (Ion Energy)$_{Wafer}$/(Ion Energy)$_{Mask}$ | 0.71 | 0.85 | 1.00 |

[1] For Image Field 20 × 20 mm$^2$, Max. Deviation of each Image Point from the Ideal Location
[2] For Energy Spread of the Ions at Ion Source Output $\Delta E/E = \pm 0.001$, where E is the energy of the ions at source output.
Lens Definitions:
EL+ = Accelerating Einzel Lens
IL+ = Accelerating Immersion Lens
IL− = Decelerating Immersion Lens
AEL− = Decelerating Asymmetric Einzel Lens

We claim:

1. An ion-optical imaging system, comprising:
   a mask having a structure to be imaged upon a wafer and including at least one opening;
   means for supporting the wafer upon which said structure is to be imaged at a distance from said mask along an optical axis; and
   a lens system disposed between said mask and said wafer and essentially consisting of a set of two collecting lenses including a first collecting lens following said mask along said axis in a direction of ion beam travel toward said wafer, and a second collecting lens spaced from the first collecting lens along said axis in said direction,
   said mask being disposed approximately in an object-side focal plane of the first collecting lens,
   the wafer being positioned in a vicinity of an image-side focal plane of the second collecting lens following the mask, and
   the set is constituted of one of the following lens-type sets:
   (a) two accelerating Einzel lenses;
   (b) an accelerating immersion lens and a decelerating immersion lens wherein the accelerating immersion lens is the first collecting lens following the mask;
   (c) an accelerating immersion lens and a decelerating asymmetric Einzel lens wherein the accelerating immersion lens is the first collecting lens following the mask;
   (d) an accelerating asymmetric Einzel lens and a decelerating immersion lens wherein the accelerating asymmetric Einzel lens is the first collecting lens following the mask; and
   (e) an accelerating asymmetric Einzel lens and a decelerating asymmetric Einzel lens wherein the accelerating asymmetric Einzel lens is the first collecting lens following the mask.

2. The ion-optical imaging system defined in claim 1 wherein a crossover of the first collecting lens following the mask lies in an object-side focal plane of the second collecting lens following the mask.

3. The ion-optical imaging system defined in claim 2, further comprising:
   an ion source disposed along said axis ahead of said mask for generating an ion beam;
   a mass separator formed as an ExB filter between said ion source and said mask along said axis;
   a condensing lens ahead of said mass separator along said axis and preferably being an Einzel lens; and
   an illumination lens following said mass separator along said axis and being a lens selected from the group which consists of:
   an immersion lens,
   an accelerating Einzel lens,
   a decelerating Einzel lens, and
   at least one solenoid.

4. The ion-optical imaging system defined in claim 3 wherein said set is constituted of two accelerating Einzel lenses.

5. The ion-optical imaging system defined in claim 3 wherein said set is constituted of an accelerating immersion lens and a decelerating immersion lens wherein the accelerating immersion lens is the first collecting lens following the mask.

6. The ion-optical imaging system defined in claim 3 wherein said set is constituted of an accelerating immersion lens and a decelerating asymmetric Einzel lens wherein the accelerating immersion lens is the first collecting lens following the mask.

7. The ion-optical imaging system defined in claim 3 wherein said set is constituted of an accelerating asymmetric Einzel lens and a decelerating immersion lens wherein the accelerating asymmetric Einzel lens is the first collecting lens following the mask.

8. The ion-optical imaging system defined in claim 3 wherein said set is constituted of an accelerating asymmetric Einzel lens and a decelerating asymmetric Einzel lens wherein the accelerating asymmetric Einzel lens is the first collecting lens following the mask.

9. The ion-optical imaging system defined in claim 3 wherein said illumination lens is an immersion lens.

10. An ion-optical imaging system, comprising:

a mask having a structure to be imaged upon a wafer and including at least one opening;

means for supporting the wafer upon which said structure is to be imaged at a distance from said mask along an optical axis;

a lens system disposed between said mask and said wafer and essentially consisting of a set of two collecting lenses including a first collecting lens following said mask along said axis in a direction of ion beam travel toward said wafer, and a second collecting lens spaced from the first collecting lens along said axis in said direction, said mask being disposed approximately in an object-side focal plane of the first collecting lens, the wafer being positioned in a vicinity of an image-side focal plane of the second collecting lens following the mask, and the set is constituted of one of the following lens-type sets:

(a) two accelerating Einzel lenses;

(b) an accelerating immersion lens and a decelerating immersion lens wherein the accelerating immersion lens is the first collecting lens following the mask;

(c) an accelerating immersion lens and a decelerating asymmetric Einzel lens wherein the accelerating immersion lens is the first collecting lens following the mask;

(d) an accelerating asymmetric Einzel lens and a decelerating immersion lens wherein the accelerating asymmetric Einzel lens is the first collecting lens following the mask; and (e) an accelerating asymmetric Einzel lens and a decelerating asymmetric Einzel lens wherein the accelerating asymmetric Einzel lens is the first collecting lens following the mask, a crossover of the first collecting lens following the mask lying in an object-side focal plane of the second collecting lens following the mask;

an ion source disposed along said axis ahead of said mask for generating an ion beam;

a mass separator formed as an ExB filter between said ion source and said mask along said axis;

a condensing lens ahead of said mass separator along said axis and preferably being an Einzel lens; and an illumination lens following said mass separator along said axis and being an accelerating Einzel lens.

11. An ion-optical imaging system, comprising:

a mask having a structure to be imaged upon a wafer and including at least one opening;

means for supporting the wafer upon which said structure is to be imaged at a distance from said mask along an optical axis;

a lens system disposed between said mask and said wafer and essentially consisting of a set of two collecting lenses including a first collecting lens following said mask along said axis in a direction of ion beam travel toward said wafer, and a second collecting lens spaced from the first collecting lens along said axis in said direction, said mask being disposed approximately in an object-side focal plane of the first collecting lens the wafer being positioned in a vicinity of an image-side focal plane of the second collecting lens following the mask, and the set is constituted of one of the following lens-type sets:

(a) two accelerating Einzel lenses;

(b) an accelerating immersion lens and a decelerating immersion lens wherein the accelerating immersion lens is the first collecting lens following the mask;

(c) an accelerating immersion lens and a decelerating asymmetric Einzel lens wherein the accelerating immersion lens is the first collecting lens following the mask;

(d) an accelerating asymmetric Einzel lens and a decelerating immersion lens wherein the accelerating asymmetric Einzel lens is the first collecting lens following the mask; and (e) an accelerating asymmetric Einzel lens and a decelerating asymmetric Einzel lens wherein the accelerating asymmetric Einzel lens is the first collecting lens following the mask, a crossover of the first collecting lens following the mask lying in an object-side focal plane of the second collecting lens following the mask;

an ion source disposed along said axis ahead of said mask for generating an ion beam;

a mass separator formed as an ExB filter between said ion source and said mask along said axis;

a condensing lens ahead of said mass separator along said axis and preferably being an Einzel lens; and an illumination lens following said mass separator along said axis and being a decelerating Einzel lens.

12. An ion-optical imaging system, comprising:

a mask having a structure to be imaged upon a wafer and including at least one opening;

means for supporting the wafer upon which said structure is to be imaged at a distance from said mask along an optical axis;

a lens system disposed between said mask and said wafer and essentially consisting of a set of two collecting lenses including a first collecting lens following said mask along said axis in a direction of ion beam travel toward said wafer, and a second collecting lens spaced from the first collecting lens along said axis in said direction, said mask being disposed approximately in an object-side focal plane of the first collecting lens, the wafer being positioned in a vicinity of an image-side focal plane of the second collecting lens following the mask, and the set is constituted of one of the following lens-type sets:

(a) two accelerating Einzel lenses;

(b) an accelerating immersion lens and a decelerating immersion lens wherein the accelerating immersion lens is the first collecting lens following the mask;

(c) an accelerating immersion lens and a decelerating asymmetric Einzel lens wherein the accelerating immersion lens is the first collecting lens following the mask;

(d) an accelerating asymmetric Einzel lens and a decelerating immersion lens wherein the accelerating asymmetric Einzel lens is the first collecting lens following the mask; and (e) an accelerating asymmetric Einzel lens and a decelerating asymmetric Einzel lens wherein the accelerating asymmetric Einzel lens is the first collecting lens following the mask, a crossover of the first collecting lens following the mask lying in an object-side focal plane of the second collecting lens following the mask;

an ion source disposed along said axis ahead of said mask for generating an ion beam;

a mass separator formed as an ExB filter between said ion source and said mask along said axis;

a condensing lens ahead of said mass separator along said axis and preferably being an Einzel lens; and an illumination lens following said mass separator along said axis and being at least one solenoid.

* * * * *